United States Patent
Kido et al.

(10) Patent No.: US 7,206,241 B2
(45) Date of Patent: Apr. 17, 2007

(54) SEMICONDUCTOR DEVICE AND PROGRAMMING METHOD

(75) Inventors: Kazunari Kido, Kanagawa (JP); Yasushi Kasa, Tokyo (JP); Minoru Yamashita, Kanagawa (JP); Kazuhiro Kurihara, Tokyo (JP); Hiroaki Wada, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/126,558

(22) Filed: May 11, 2005

(65) Prior Publication Data
US 2005/0276112 A1    Dec. 15, 2005

Related U.S. Application Data

(63) Continuation of application No. PCT/JP2004/006264, filed on May 11, 2004.

(51) Int. Cl.
G11C 7/02    (2006.01)
(52) U.S. Cl. .............. 365/210; 365/185.18; 365/185.2
(58) Field of Classification Search ............... 365/210, 365/185.18, 185.2
See application file for complete search history.

(56) References Cited

U.S. PATENT DOCUMENTS

| | | | |
|---|---|---|---|
| 5,592,000 A | 1/1997 | Onishi et al. ............... 357/315 |
| 6,215,697 B1* | 4/2001 | Lu et al. ................. 365/185.03 |
| 6,587,364 B1* | 7/2003 | Kablanian et al. ........... 365/63 |
| 2003/0156457 A1 | 8/2003 | Ooishi ................... 365/185.21 |
| 2004/0027857 A1 | 2/2004 | Ooishi ................... 365/185.11 |
| 2004/0151015 A1* | 8/2004 | Do ............................. 365/94 |
| 2005/0157541 A1* | 7/2005 | Iwata ......................... 365/158 |

FOREIGN PATENT DOCUMENTS

| | | |
|---|---|---|
| JP | 6-111592 A | 4/1994 |
| JP | 2003-242794 A | 8/2003 |
| JP | 2004-71006 A | 3/2004 |

* cited by examiner

*Primary Examiner*—Amir Zarabian
*Assistant Examiner*—Kretelia Graham

(57) ABSTRACT

The semiconductor device of the present invention includes at least one dummy cell of a programmed state proximately located to an edge of a reference cell array. Thus, the leak current does not flow when a data of the cell on the edge of the reference cell array is read out. The memory cell located around the center of the reference cell array has neighboring cells of the programmed state, and the leak current can be prevented when the data is read out from all the reference cells. Thus, the reference current can be supplied stably.

13 Claims, 10 Drawing Sheets

SEMICONDUCTOR DEVICE AND PROGRAMMING METHOD

CROSS REFERENCE TO RELATED APPLICATIONS

This is a continuation of International Application No. PCT/JP2004/006264, filed May 11, 2004.

BACKGROUND OF THE INVENTION

1. Field of the Invention

The present invention relates to a semiconductor device of a virtual ground type and a method for programming a reference cell. Neighboring memory cells share a drain line and a source line in the semiconductor device of the virtual ground type.

2. Description of the Related Art

In a nonvolatile semiconductor device such as a flash memory, a current flowing through a reference cell of a given threshold is used as a reference current. The reference current is compared with a drain current of the memory cell to be read out at the time of reading. The data is judged to be "1" or "0", depending on whether the drain current of the read-out memory cell is larger than the reference current.

When the data is read out from the memory cell or the reference cell of the memory cell array of the virtual ground type, a voltage is applied to the drain of the cell and a ground potential Vss is set to the source so that a current flows. A pre-charge voltage is applied to a bit line next to the drain line. The leak current can be prevented by supplying the same voltage to the bit line next to the drain line.

It is to be noted that it is impossible to obtain the drain voltage and the pre-charge voltage completely equal to each other. If the data is read out of a memory cell and the next memory cell has an erased state, the current leakage will occur. If the next memory cell has a programmed state, the current will not be leaked due to the electric charge. That is to say, the state of the data in the neighboring memory cell determines whether or not the leak current flows, and this affects the read-out characteristics.

A description will be given in detail with reference to FIGS. 1A and 1B. FIGS. 1A and 1B show a memory cell of a MONOS type having a charge trap layer. Two-bit information is programmable by trapping the charge in both right and left regions of the charge trap layer. A white circle denotes that the charge is not trapped (erased state). A black circle denotes that the charge is trapped (programmed state). As shown in FIG. 1A, when a memory cell (Cell (7) in FIG. 1A) located proximately to the drain line of the memory cell (Cell (0) in FIG. 1A) to be read out has the programmed state, the electrons do not move due to the charge caused by the programmed state and thereby the leak current does not flow. As shown in FIG. 1B, however, if the memory cell (Cell (7)) located proximately to drain line of the memory cell (Cell (0)) to be read out is not programmed, the leak current flows. A bit line located proximately to the pre-charged bit line has a floating state, the leak current flows from the pre-charged bit line to the bit line of the floating state. Furthermore, the leak current also passes from the drain line to the pre-charged bit line on which the voltage is decreased.

Even if the leak current flows, and if the leak current flows in the same manner, the read-out characteristics do not change when all the reference currents are read out. However, with respect to the reference cell, the current is leaked in the reference cell of a specific address.

As shown in FIGS. 1A and 1B, core cells and the reference cells are included in the same cell array. If the reference cell is provided next to the core cell as shown in FIGS. 1A and 1B, the current leakage in the reference cell depends on the state of the core cell.

SUMMARY OF THE INVENTION

The present invention has been made in view of the above circumstances and has an object of providing a semiconductor device and a programming method so that the reference current can be supplied stably, regardless of a location of the cell to be read out.

According to an aspect of the present invention, there is provided a semiconductor device including: a core cell array having memory cells; a reference cell array having reference cells used to identify data in the memory cells; and a dummy cell array including a programmable dummy cell that is located proximately to the reference cell array. The leak current does not flow when the data is read out of the edge of the reference cell array, by arranging at least one programmed dummy cell proximately to the reference cell array. The cell located around the center in the reference cell array has neighboring programmed reference cells, and this prevents the leak current from flowing when the data is read out from all the reference cells. It is thus possible to supply the reference voltage stably.

On the above semiconductor device, the dummy cell array may be connected to a word line to which the core cell array and the reference cell array are connected and is located between the core cell array and the reference cell array. The dummy cell array is connected to a word line to which the core cell array and the reference cell array are connected and is located between the core cell array and the reference cell array; and the dummy cell array comprises another programmable dummy cell that is located proximately to the core cell array. The dummy cell array including the dummy cell is located between the core cell array and the reference cell array, and the reference current is available in the reference cell array regardless of the data stored in the core cell array.

On the above semiconductor device, the core cell array, the reference cell array and the dummy cell array may be of a virtual ground type in which neighboring cells share a bit line, and each of the cells is capable of storing two bits of data; and one of the two bits of the programmable dummy cell closer to the reference cell array has a programmed state. The bit located proximately to the reference cell array is programmed, and this can prevent the current leakage stably, when the reference current is read out of the edge of the reference cell array.

The semiconductor device may include a decoder generating a decode signal commonly applied to the core cell array, the reference cell array and the dummy cell array. The core cell array, the reference cell array, and the dummy cell array can be selected with the common decode signal, and so the decode does not have to be changed newly to provide the dummy cell array.

The semiconductor device may include a control circuit that programs the reference cells so that programming of the reference cells starts from both edges of the reference cell array and progresses towards the center thereof. The programmed dummy cell is located adjacently to the reference cell array. The leak current can be prevented by programming from the edge of the reference cell array towards the center of the cell array.

The semiconductor device may include a control circuit that programs the programmable dummy cell located at an edge of the dummy cell array after erasing data in the core cell array and the reference cell array, and then programs the reference cell array. When programming the reference cell array, the reference cell array is programmed after the dummy cell is programmed. Thus, the current leakage does not flow when the cell located adjacently to the reference cell array is programmed.

On the above semiconductor device, the memory cells may have a charge trap layer made of an insulator, and bits of data are stored in the charge trap layer.

On the above semiconductor device, the programmable dummy cell located proximately to the reference cell array may have a programmed state. The dummy cell array comprises another programmable dummy cell, and the reference cell array is sandwiched between the programmable dummy cell and said another programmable dummy cell. The dummy cell array comprises multiple programmable dummy cells, and only programmable dummy cell or cells among the multiple programmable dummy cells located proximately to the reference cell array have a programmed state.

On the above semiconductor device, the programmable dummy cell may be located next to the reference cell array.

According to an aspect of the present invention, there is provided a method of programming a reference cell array having reference cells used to identify data in memory cells, comprising the steps of: erasing data in the memory cells and the reference cells of the reference cell array; programming a dummy cell of a dummy cell array located proximately to the reference cell array; and programming the reference cell array after the step of programming. The dummy cell is programmed, and then the reference cell array is programmed. Thus, the current leakage does not occur when the reference cell array is programmed.

The above method may be configured so as to have a step of programming of the reference cell array starts from reference cells located at both edges of the reference cells. The programmed dummy cell is provided on the edge of the dummy cell array next to the reference cell array. When the programming is progressed from the cell on the edge of the reference cell towards the center, the leak current can be prevented when programming.

DESCRIPTION OF THE PREFERRED EMBODIMENTS

A description will now be given, with reference to the accompanying drawings, of embodiments of the present invention.

Figure 1A:
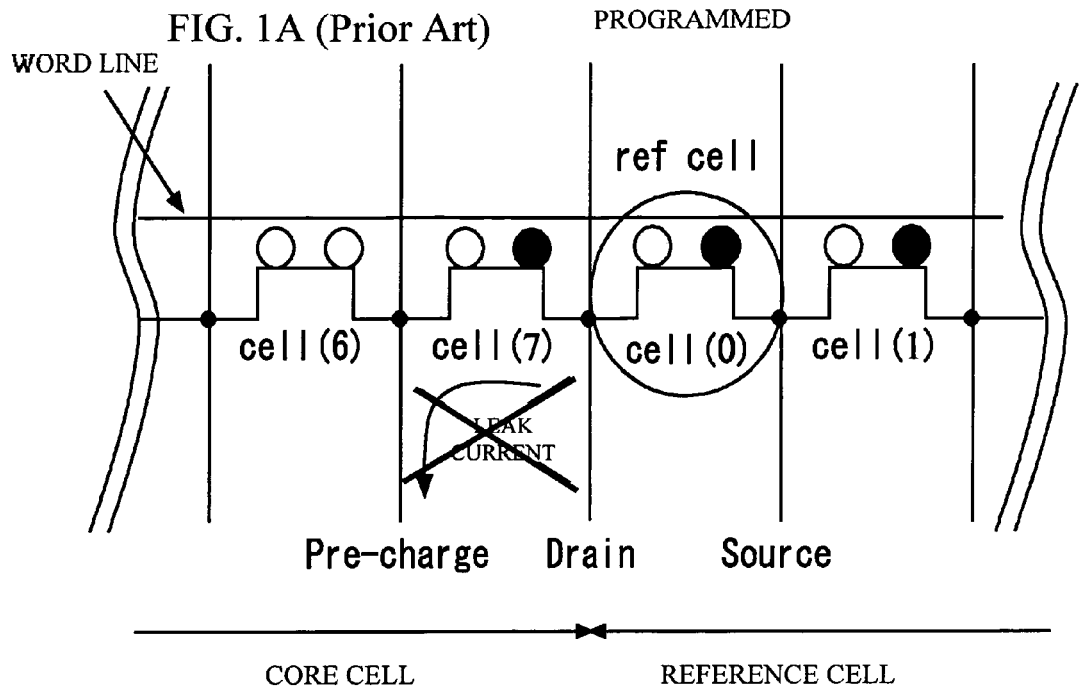
FIGS. 1A and 1B are views illustrating the leak current that is leaked from the reference cell when the data is read out.
Figure 1B:
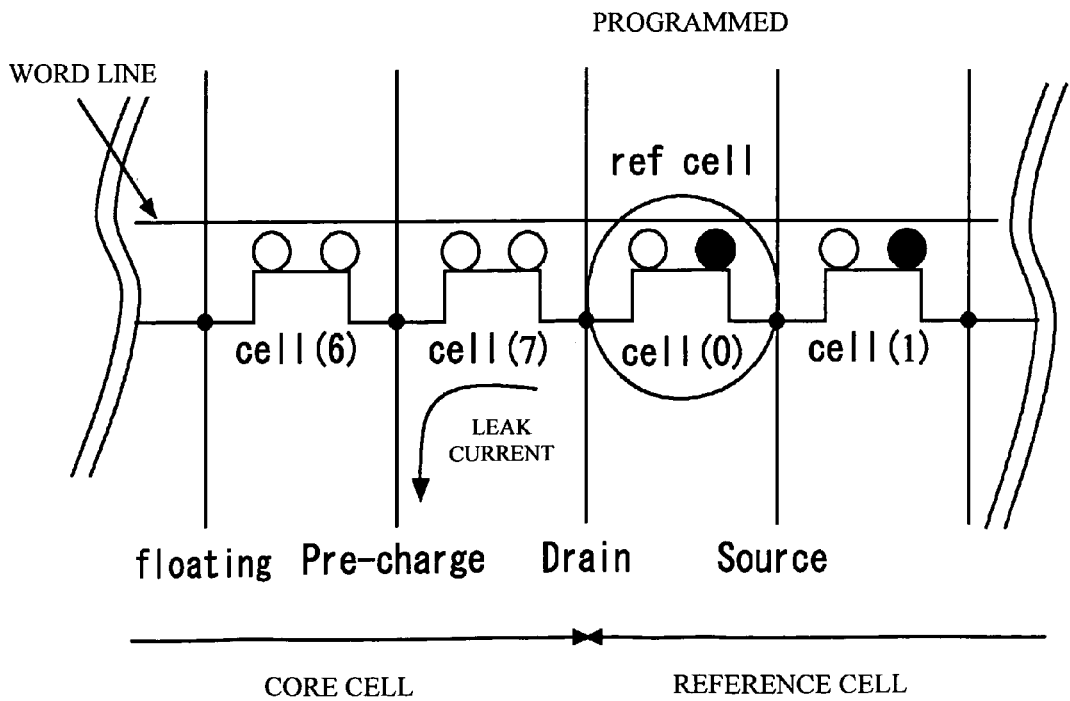
Figure 2:
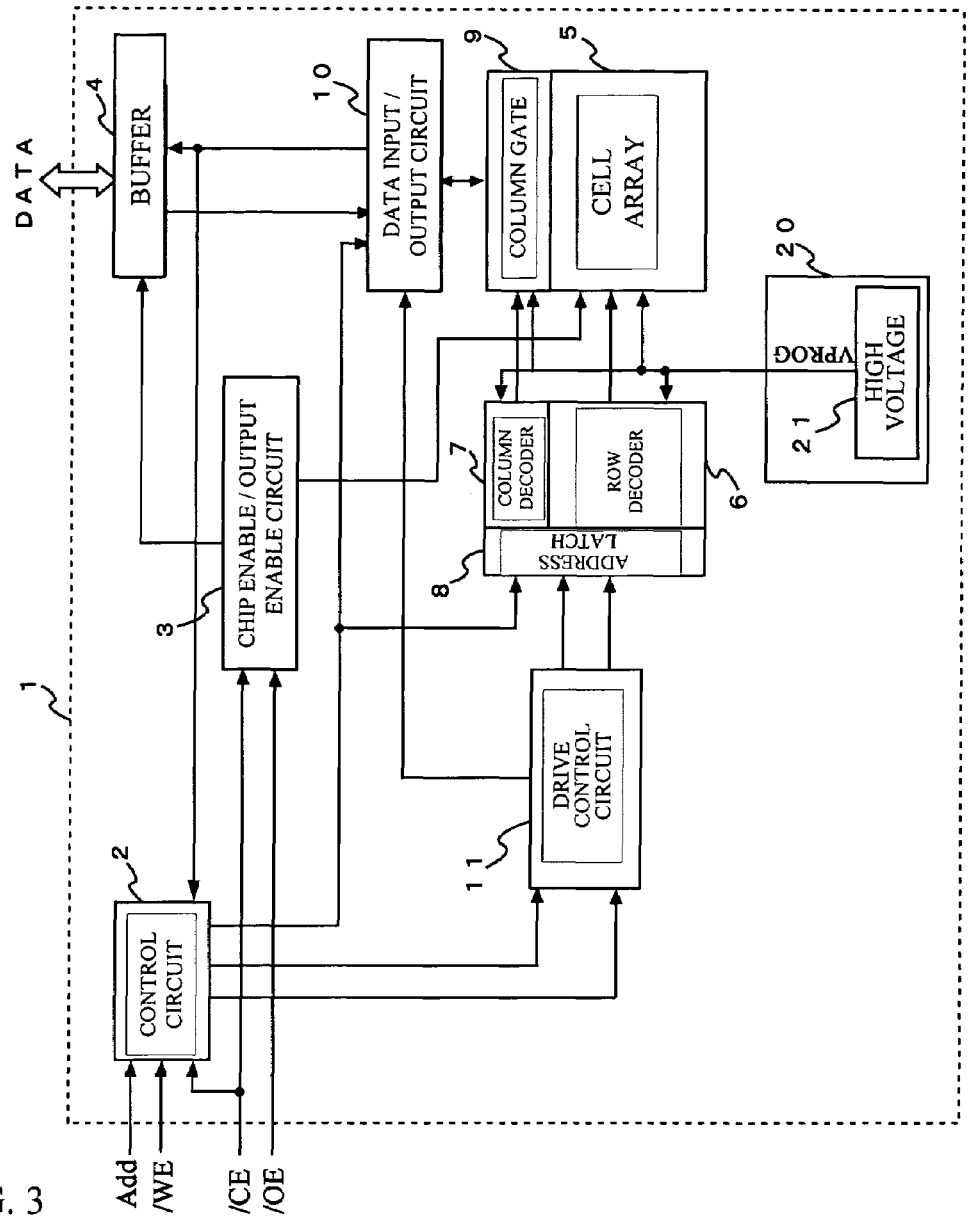
FIG. 2 is a block diagram of a configuration of a non-volatile semiconductor memory device.

FIG. 2 is a configuration of an embodiment of a non-volatile semiconductor memory device to which the present invention is applied. A non-volatile semiconductor memory device shown in FIG. 2 includes a control circuit 2, a chip enable/output enable circuit 3, an input/output buffer 4, a cell array 5, a row decoder 6, a column decoder 7, an address latch 8, a column gate 9, a data input/output circuit 10, a drive control unit 11, and a power supply unit 20. The power supply unit 20 is equipped with a high voltage generation unit 21.

The control circuit 2 receives a control signal such as write enable (/WE) or chip enable (/CE), an address signal, and a data signal from the outside, serves as a state machine based on these signals, and controls each part in the non-volatile semiconductor memory device 1.

The input/output buffer 4 receives the data from the outside, and supplies the data to the control circuit 2 and the data input/output circuit 10.

The chip enable/output enable circuit 3 receives the chip enable signal (/CE) and an output enable signal (/OE) from outside the device as the control signal, and controls an operation/non-operation of the input/output buffer 4 and the cell array 5.

The drive control unit 11 operates under the control of the control circuit 2, and controls the drive of the cell array 5, the row decoder 6, and the column decoder 7 to read, write, and erase the data.

The data input/output circuit 10 operates under the control of the control circuit 2 to read and write the data to the cell array 5. The data input/output circuit 10 will be described later in detail.

The row decoder 6 selects and drives word lines (WL) based on each address, when the data is written, erased, or read. A given voltage is supplied to a word line driver (not shown).

The column decoder 7 controls the column gate 9 based on the address retained in the address latch 8. The column gate 9 is selected by the column decoder 7, and then a corresponding sense amplifier is selected in the data input/output circuit 10. Consequently, the data is read out to the sense amplifier.

The cell array 5 is a memory array of a virtual ground, and has an arrangement of memory cells, word lines, and bit lines. Each memory cell stores data of two bits. A laminated film is interposed between the control gate and the semiconductor substrate. The laminated film is made up of an oxide film, a nitride film, and another oxide film, which are sequentially laminated. The charge is trapped in the nitride film to change the threshold value and distinguish between "0" and "1" of the data. The charge trap layer including the nitride film and the like serves as an insulation film, in which the charge does not move. Two bits can be stored in one cell by retaining the charge on both sides of the charge trap layer. This structure of storing two bits in one cell may be referred to as MirrorBit. The cell of a floating gate type having a polysilicon layer therein may be employed for the memory cell. In this case, multiple bits of information can be stored in one cell, by changing the charge amount stored in the floating gate.

When the data is read out, the data of the memory cell designated by the activated word line is read out to the bit line. When the data is written (hereinafter referred to as programmed) or erased, the charge is applied to or removed from the memory cell, by setting the appropriate potentials to the word line and the bit line according to the respective operations.

Figure 3:
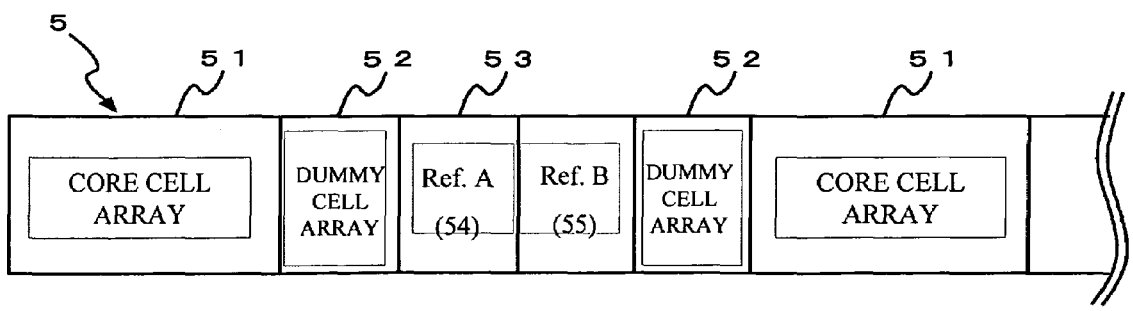
FIG. 3 shows a configuration of a cell array.

The cell array 5 is described with reference to FIG. 3. The cell array 5 includes, as shown in FIG. 3, a core cell array 51 that stores the data therein, a reference cell array 53 that supplies the reference current to judge the read-out data value, and a dummy cell array 52. The reference cell array 53 comprises a reference cell array A (also referred to as Ref. A) 54 that stores a page (for example, eight cells) of data "10" and a reference cell array B (also referred to as Ref. B) 55 that stores a page (for example, eight cells) of data "01". The dummy cell array 52 is located between the core cell array 51 and the reference cell array 53.

Figure 4A:
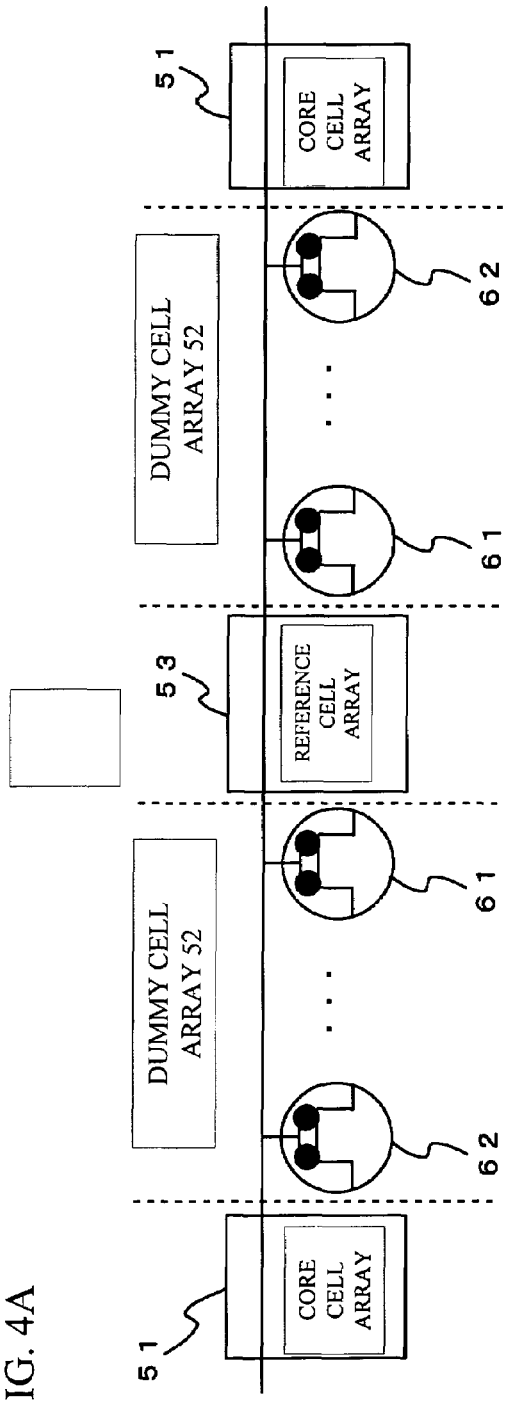
FIGS. 4A and 4B are views illustrating edges of a dummy cell array are programmed.
Figure 4B:
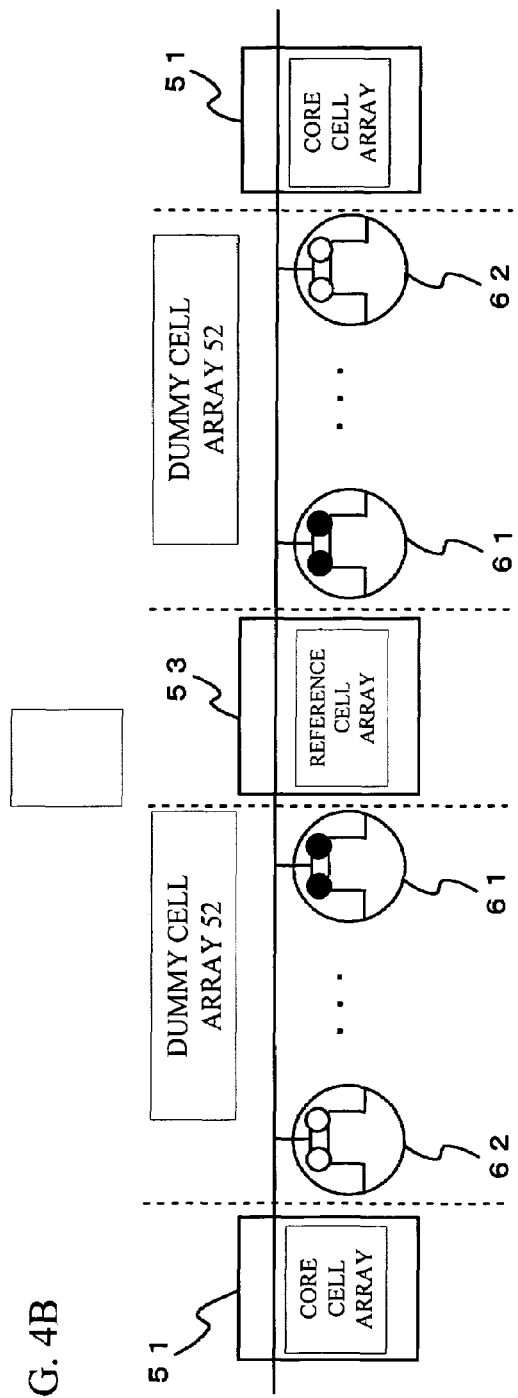

FIG. 4A shows a configuration of the dummy cell array 52. Referring to FIG. 4A, the dummy cell array 52 comprises multiple (eight) programmable memory cells. Memory cells 61 and 62 located on both edges of the dummy cell array 52 are programmed so that the leak current can be prevented when the data is read out of the reference cell in the reference cell array 53 located proximately to the dummy cells 61. Preferably, the programmed bit is the bit located proximately to the reference cell in the dummy cell 61. However, only the opposite bit in the reference cell may be programmed. More preferably, the both bits are programmed. Furthermore, the dummy cells 61 and 62 located on the both edges are programmed in the dummy cell array 52 shown in FIG. 4A. In other words, the dummy cell 62 next to the core cell array 51 and the dummy cell 61 next to the reference cell array 53 are both programmed. As show in FIG. 4B, however, only the dummy cell 61 next to the reference cell array 53 may be programmed.

Figure 5:
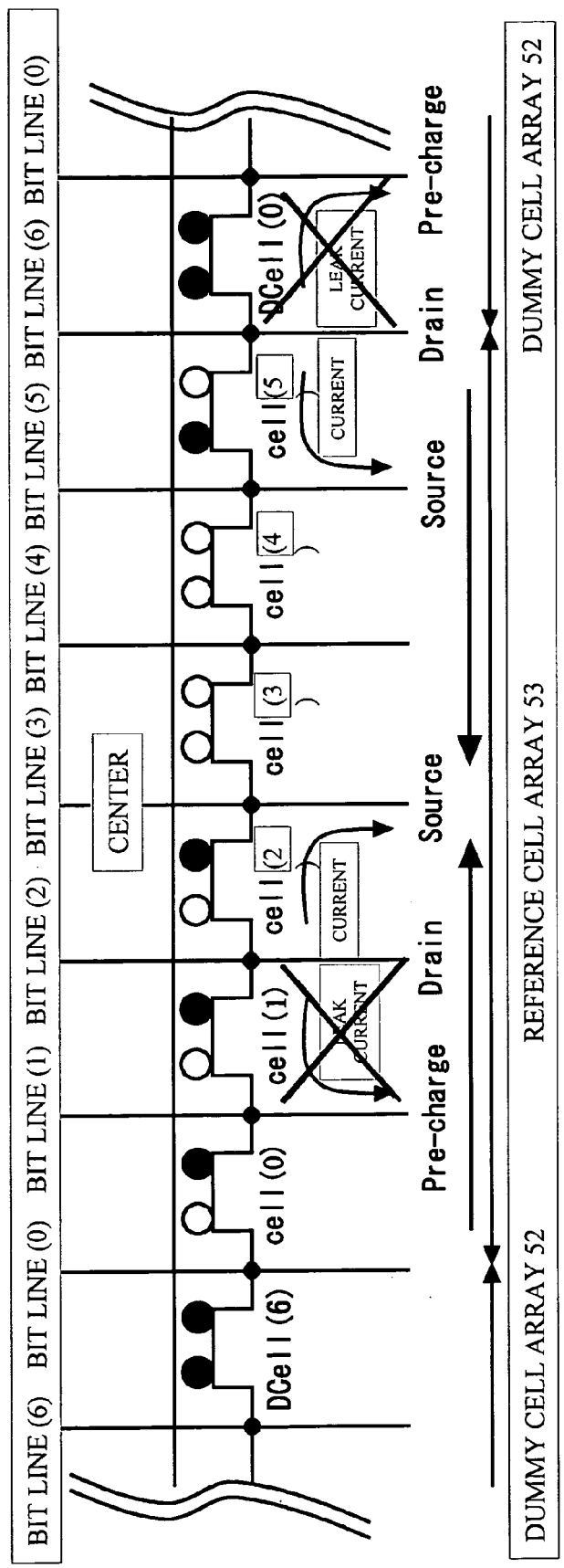
FIG. 5 shows a data writing procedure from a center of the reference cell array towards edges.
Figure 6:
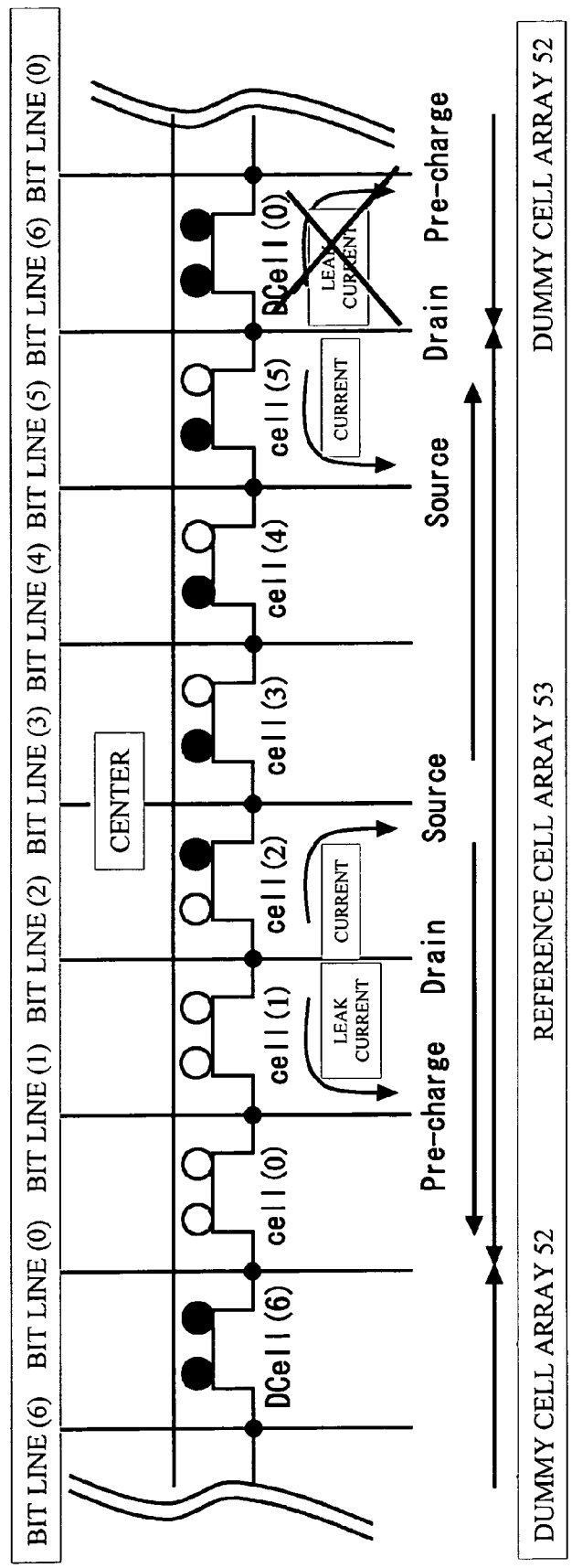
FIG. 6 shows a leaked current when a programming progresses from the center towards both edges.

When the reference cell array 53 is programmed, programming is progressed from the edges of the reference cell array 53 towards the center of the reference cell array 53, as shown in FIG. 5. If the cell array 5 includes the programmed dummy cell array 52 located between the core cell array 51 and the reference cell array 53 as shown in FIG. 3 and the programming is progressed from the center of the reference cell array 53, the current is leaked when the reference cell around the center is programmed. The current is not leaked when the reference cell located on the edges are programmed. For example, when write verification is performed on a right bit of a Cell (2) shown in FIG. 6, a bit line (3) located on the right of the Cell (2) is connected to the source, a bit line (2) located on the left of the Cell (2) is connected to the drain, and a bit line (1) located on the opposite side of the source line is connected to the precharge. Here, if the Cell (1) located next to the drain line of the Cell (2) is not programmed, the leak current will flow from the drain line (the bit line (2)) to the pre-charged bit line (1). In the same manner, if the data is written in a left bit of a Cell (5), the leak current will not flow from the drain line (the bit line (6) shown in FIG. 5) to the bit line (0) of the pre-charged state. This is because a DCell (0) next to the drain line of a Cell (5) is programmed. That is to say, when the programming is progressed from the center of the reference cell towards the edges, the leak current flows in programming the cell located around the center in which nothing is written. However, the dummy cell 61 of the programmed state is provided on the edge of the reference cell, and thereby the leak current does not flow. The programming is progressed from the edges of the reference cell array 53 towards the center, as shown in FIG. 5, in order to prevent the change of the leak current around the center and the edges of the reference cell array 53 as described above. The dummy cell 61 is always programmed, as shown in FIG. 4, in the dummy cell array 52 provided adjacently on both sides of the reference cell array 53. The leak current can be prevented any time by programming from the both edges towards the center.

Next, a description will be given of the reference cell array 53 in detail. The reference cell array 53 is erased together with the core cell array 51 so as to match the cycling characteristics of programming and erasing with those of the core cell array 51. Subsequently, the data "10" is programmed in the eight cells of the reference cell array A 54, and the data "01" is programmed in the eight cells of the reference cell array B 55.

If the second bit from the left edge in the core cell array 51 is selected to read out the data, the second bit from the left edge is also selected in the reference cell array A 54 and reference cell array B 55. The reference current is an averaged current of the currents of the reference cells having the read-out data "10" and "01" therein.

Figure 7:
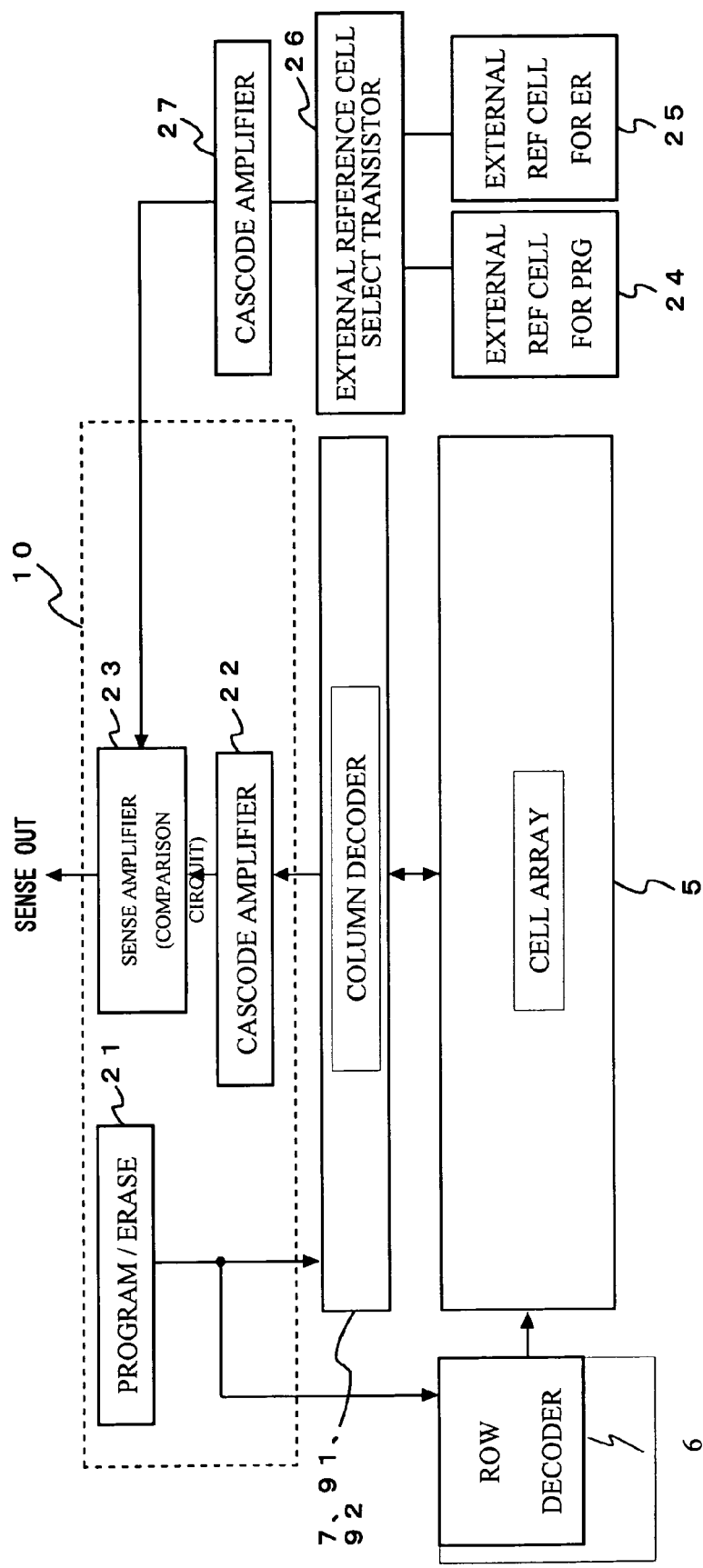
FIG. 7 shows a configuration of a data input/output circuit.

FIG. 7 shows a configuration of the data input/output circuit 10 in detail. Referring to FIG. 7, the data input/output circuit 10 comprises a program/erase circuit 21, a cascode amplifier 22, and a sense amplifier (comparison circuit) 23.

The program/erase circuit 21 generates a write pulse and an erase pulse to program the data in the cell array 5 and erase the data in the cell array 5. The cascode amplifier 22 converts the current of the data or the reference cell read out onto the bit line through the column gate 9 into the voltage.

The sense amplifier (comparison circuit) 23 compares the reference voltage with the voltage of the data when the data is read out. The reference voltage is the voltage of the reference cell, and the voltage of the data is supplied from the core cell array 51. Then, the sense amplifier (comparison circuit) 23 judges whether the data is 0 or 1. This result is applied to the outside of the circuit via the input/output buffer 4 as the read-out data. The verification operation accompanied by the programming operation and erasing operation is performed by comparing the voltage of the data supplied from the core cell array 51 with the reference voltage for the program verification or the reference voltage for the erase verification. The reference voltage for the program verification is read out of an external reference cell 24 for program verification (also referred to as external Ref Cell for PGM) by an external reference cell selection transistor 26 shown in FIG. 7. In the same manner, the reference voltage for erase verification is read out of an external reference cell 25 for erase verification (also referred to as external Ref Cell for ER) by the external reference cell selection transistor 26. The reference current selected by the external reference cell selection transistor 26 is converted into the voltage by the cascode amplifier 27, and is applied to the sense amplifier (comparison circuit) 23. The sense amplifier (comparison circuit) 23 compares the voltage of the data supplied from the core cell array 51 with the reference voltage for programming or erasing.

Figure 8:
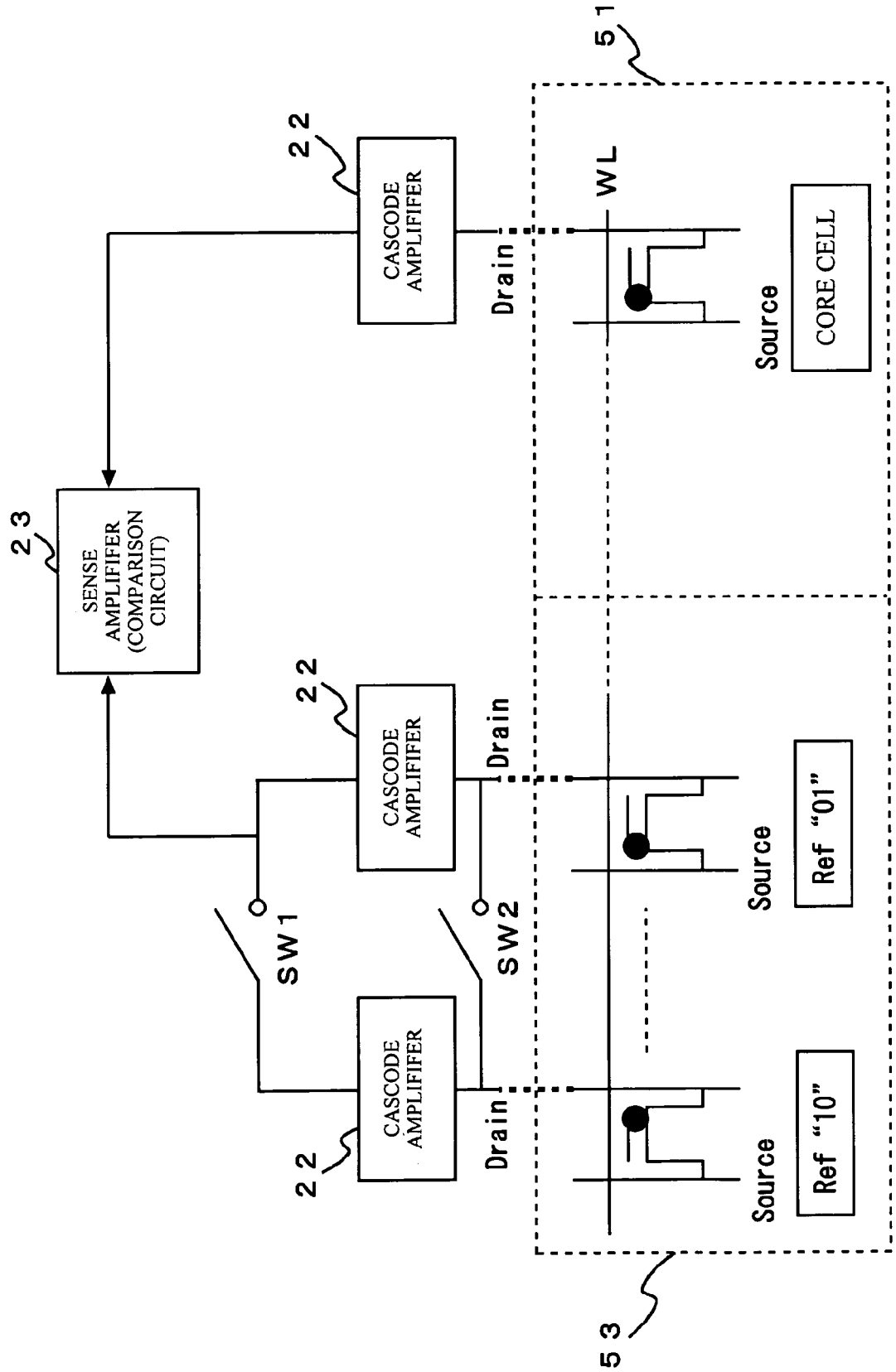
FIG. 8 shows a configuration to compare a reference current and a current to read out the data.

FIG. 8 shows a circuit diagram in detail for judging the read-out data of the core cell array 51. As described, the reference cell array 53 comprises the reference cell array A 54 storing the data of "10" and the reference cell array B 55 storing the data of "01". The number of the reference cell arrays A 54 is equal to that of the reference cell arrays B 55.

The reference cells storing the data of "01" and "10" are respectively selected in the column gate 9 shown in FIG. 2, and the reference current passes from the selected reference cell. The cascode amplifier 22 converts the current values of these reference currents into the voltage values. Switches SW1 and SW2 shown in FIG. 8 are short-circuited to measure the average of the voltage values, and the average voltage value is output to the sense amplifier (comparison circuit) 23. On the other hand, the current flowing through the bit line selected by the column gate 9 is read out of the core cell in the core cell array 51, and is converted into the voltage value in the cascode amplifier 22. The sense amplifier (comparison circuit) 23 judges whether the data is 0 or 1 after comparing the voltage value of the data with the average voltage value of the reference cell.

Figure 9:
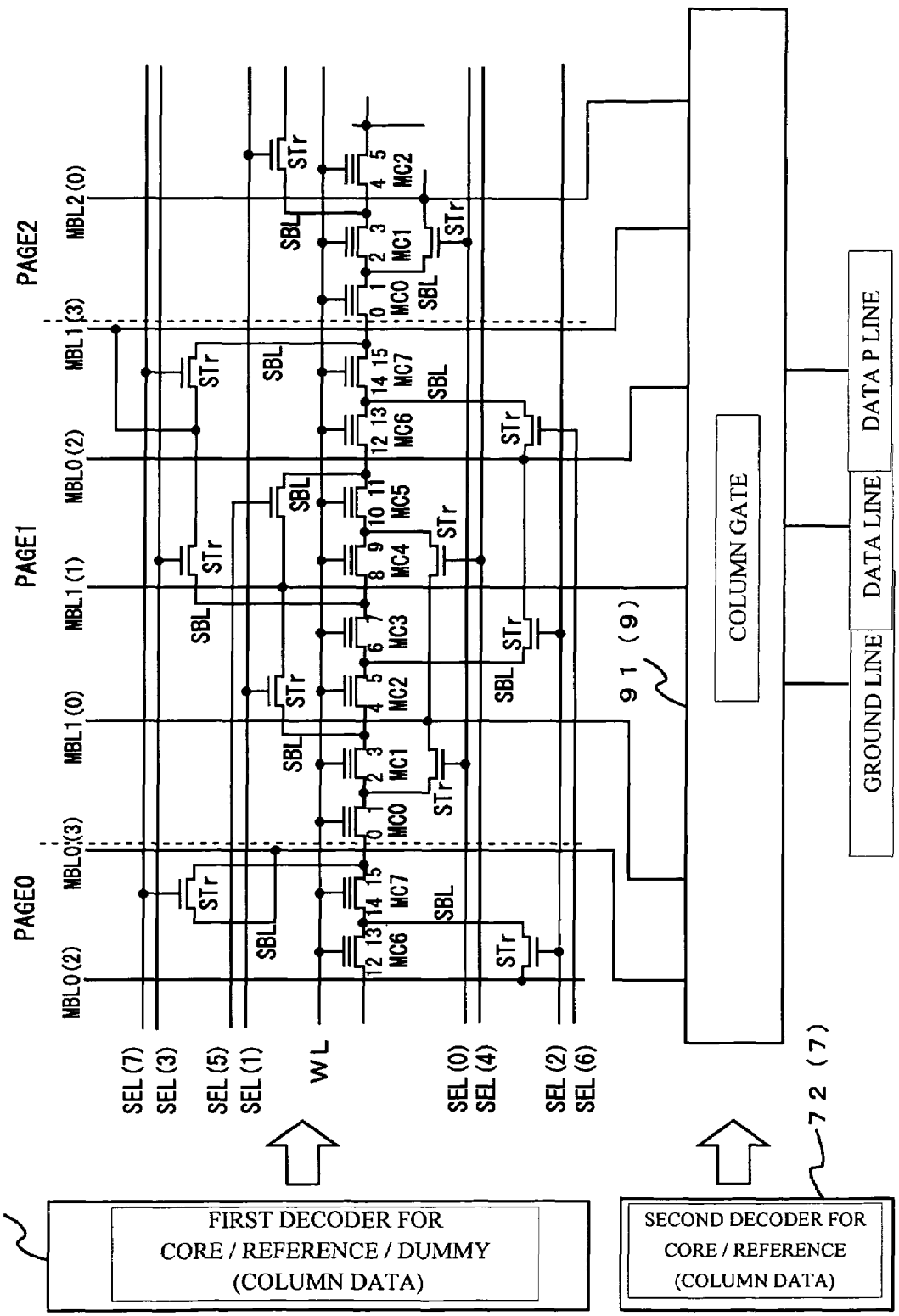
FIG. 9 shows a configuration of a core cell array, a decoder that selects the memory cell in the core cell array, and select transistors.

FIG. 9 shows the core cell array 51, the column decoder 7 that selects the memory cell of the core cell array 51, and the column gate 9 in detail. The core cell array 51 comprises multiple word lines WL (only one WL is shown in FIG. 9 for clarity), multiple metal bit lines MBL, and memory cells MC. The memory cells MC are provided in proximity to cross points of the word lines WL and the metal bit lines MBL, and are arranged in a matrix. Two memory cells MC are formed between two metal bit lines MBL. One page, which is a unit of the write or read, comprises eight memory cells MC (MC0 through MC7 in FIG. 9), and two bits can be stored in each memory cell MC. Two memory cells MC are provided between the two metal bit lines, and so a sub bit line is provided for connecting the memory cell MC to the two bit lines. The sub bit line SBL is made of a diffusion layer, is provided in parallel to the metal bit line MBL, and is connected to the metal bit line MBL through the select transistor (STr shown in FIG. 9), to which the cell signal is applied as the gate input. There are eight select transistors corresponding to each memory cell provided in each page. Eight memory cells of MC(0) through MC(7) are formed in one page, and correspondingly, eight select transistors STr (0) through STr(7) are formed. The select transistors STr are provided in every page cyclically. A first decoder (column decoder) 71 for core/reference/dummy generates and outputs a cell signal(0) through a cell signal(7) that select the select transistors STr. For example, a cell signal SEL(0) that selects the memory cell MC(0) is input, the select transistor STr(0) in each page turns on, and the memory cell MC(0) is selected in each page. The select transistor STr is also provided in the reference cell array 53 and the dummy cell array 52, which is not shown, and can select the memory cell MC corresponded by the core cell array 51 and the common decode signals thereof (the cell signal(0) through the cell signal(7)).

A column gate 91 is provided in the cell array 5 to connect the selected memory cell to the ground line and the data line. A decode signal output from a second decoder provided for core/reference selectively drives the column gate 91, and connects either the data line or the ground line to metal bit line MBL of the selected memory cell MC and the sub bit line SBL. A data P line is connected to the sub bit line SBL of the memory cell MC located proximately to the data line of the selected memory cell MC. When the data is read out, the ground line is connected to the ground potential Vss, the data line is connected to the sense amplifier 23, and the pre-charge voltage is supplied from the data P line. The pre-charge voltage is equal to the drain voltage of the selected memory cell MC. A program voltage (high voltage) is supplied from the data line when programming, and the pre-charge voltage is not supplied from the data P line.

Figure 10:
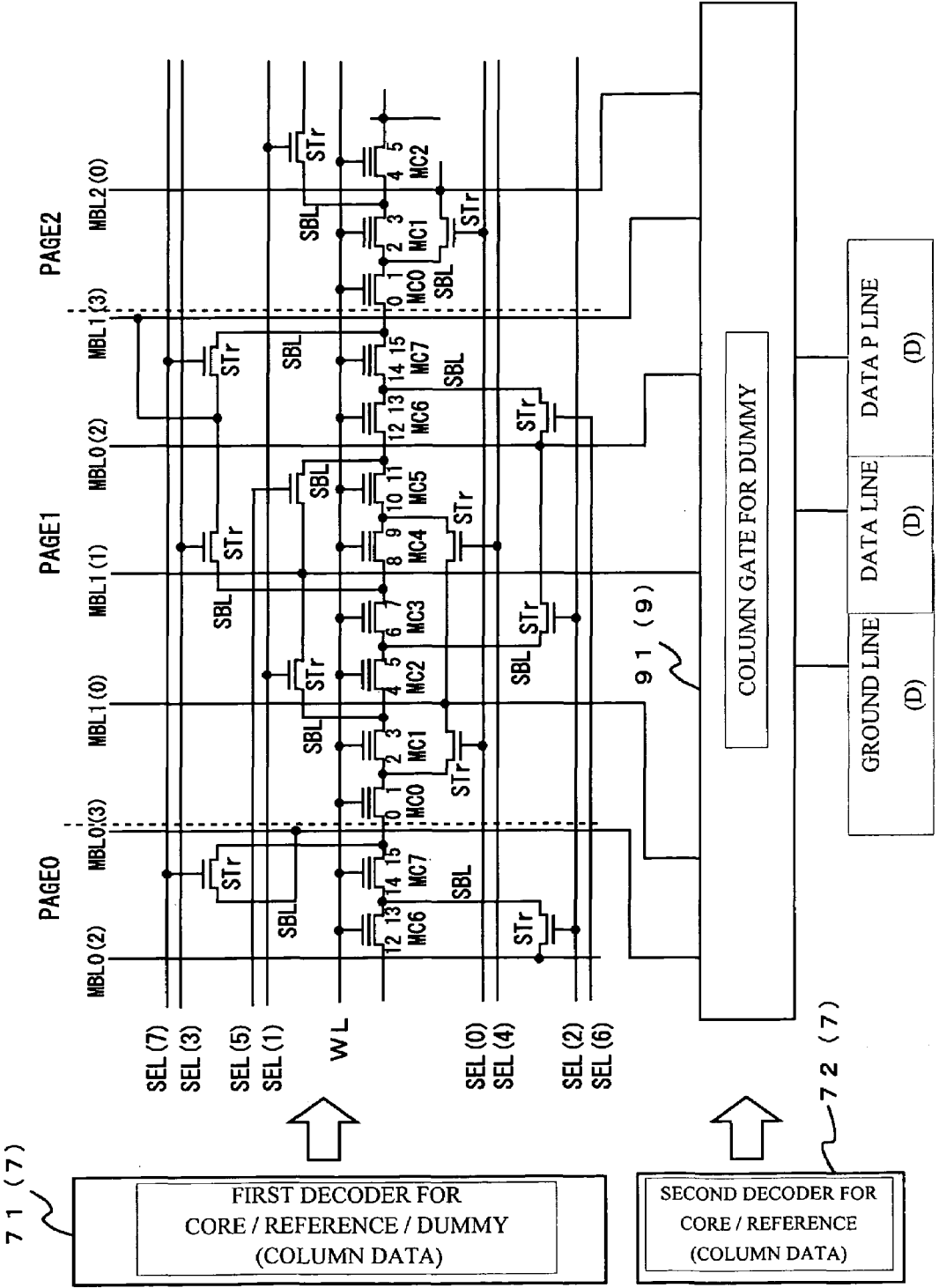
FIG. 10 shows a configuration of the dummy cell array, a decoder that selects the memory cell in the dummy cell array, and select transistors.

FIG. 10 shows the dummy cell array 52, the column decoder 7 that selects the memory cell in the dummy cell array 52, and the column gate 9 in detail. The dummy cell array 52 comprises eight memory cells MC in one page, which is same as the core cell array 51 and the reference cell array 52. The select transistors STr are provided as in the core cell array 51 and the reference cell array 53, as described above, and are selected by the decode signal (the cell signal) output from the first decoder (the column decoder) 71. In other words, the select transistors STr and the first decoder (the column decoder) 71 are commonly used by the core cell array 51, the reference cell array 53, and the dummy cell array 52.

A dummy column gate 92 that selects the sub bit line SBL is separately formed for the core cell array 51, the reference cell array 53, and the dummy cell array 52. That is to say, the decode signal that selects the core cell array 51 and the reference cell array 53 is different from the decode signal that selects the dummy cell array 52. This is because only the memory cells located on the edges in the dummy cell array 52 serve as programming cells, the memory cells being adjacently located to the core cell array 51 and the reference cell array 53, and the dummy cell array 52 is controlled by the decode signal different from those in the core cell array 51 and the reference cell array 53.

Figure 11:
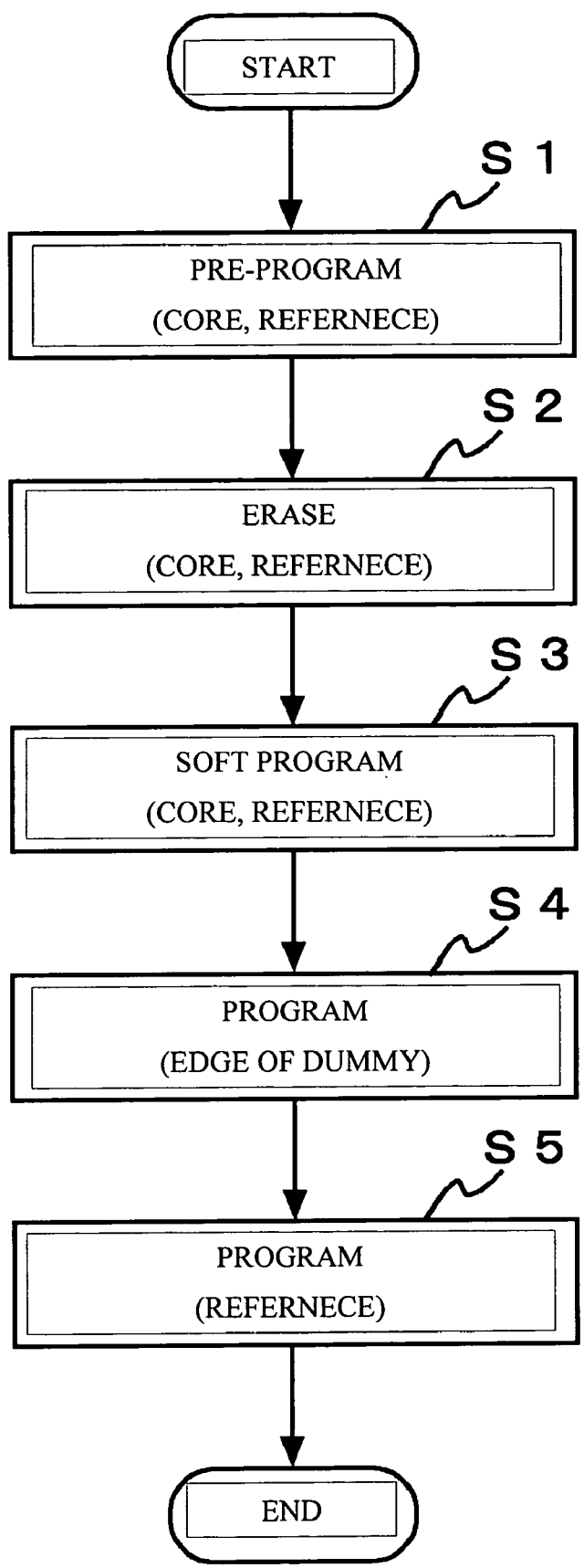
FIG. 11 is a flowchart showing a programming procedure of the reference cell array and the dummy cell array.

Referring to a flowchart shown in FIG. 11, a description will be given of a programming procedure in the reference cell array 53 and the dummy cell array 52. First, an erase command that erases the core cell array 51 is input by a user. The control circuit 2, after the command input, controls the row decoder 6, the column decoder 7, and the data input/output circuit 10, and executes a pre-program before erasing (step S1). The pre-program is executed on the memory of the erased state, in which a data 1 is stored, and then a data 0 is programmed in every cell. This pre-program is performed on the core cell array 51 and the reference cell array 53.

Next, the control circuit 2 performs an erase process in the core cell array 51 and the reference cell array 53 at a time. An erase pulse is applied to the core cell array 51 and the reference cell array 53 with the use of the program/erase circuit 21 shown in FIG. 7 so as to perform the erase process (step S2). After erasing, the erase pulse and the erase verification are repeated until a threshold voltage Vt of the bit having the highest threshold value becomes equal or smaller than a erase verification level in the distribution of a threshold voltage Vt.

Subsequently, when the threshold voltage Vt is smaller than the given threshold voltage by the erase verification operation, programming is performed on the core cell array 51 and the reference cell array 53 to increase the threshold value Vt a little, and a soft program is executed (step S3). By programming the soft program, the threshold voltages of the memory cells become equal in the core cell array 51 and the reference cell array 53.

Then, a program is executed in the dummy cells located on the edge (step S4), and the give data of 01 and 10 are programmed in 16 reference cells (step S5). Thus, the erase process of the core cell array is completed.

In this manner, the dummy cell (the dummy cell 61 shown in FIG. 4A) next to the reference cell array 53 is made to have the programmed state. This can prevent a problem in that the read characteristics are different depending on the memory cell when the program verification is performed on the reference cell array 53. Additionally, this can prevent another problem in that the read characteristics vary depending on the memory cell when the data is read out of the reference cell array 53.

Although a few preferred embodiments of the present invention have been shown and described, it would be appreciated by those skilled in the art that changes may be made in these embodiments without departing from the principles and spirit of the invention, the scope of which is defined in the claims and their equivalents. The non-volatile semiconductor memory device has been described in the above-mentioned embodiments as an example. However, the present invention is applicable to a semiconductor device having the non-volatile semiconductor memory device mounted thereon.

What is claimed is:

1. A semiconductor device comprising:
    a core cell array having memory cells;
    a reference cell array having reference cells used to identify data in the memory cells; and
    a dummy cell array including a programmable dummy cell that is located proximately to the reference cell array, wherein the dummy cell array is connected to a word line to which the core cell array and the reference cell array are connected and is located between the core cell array and the reference cell array.

2. The semiconductor device as claimed in claim 1, wherein:
    the dummy cell array comprises another programmable dummy cell that is located proximately to the core cell array.

3. The semiconductor device as claimed in claim 1, wherein the core cell array, the reference cell array and the dummy cell array are of a virtual ground type in which neighboring cells share a bit line.

4. The semiconductor device as claimed in claim 1, wherein:
    the core cell array, the reference cell array and the dummy cell array are of a virtual ground type in which neighboring cells share a bit line, and each of the neighboring cells is capable of storing two bits of data; and
    one of the two bits of the programmable dummy cell closer to the reference cell array has a programmed state.

5. The semiconductor device as claimed in claim 1, further comprising a decoder generating a decode signal commonly applied to the core cell array, the reference cell array and the dummy cell array.

6. A semiconductor device comprising:
    a core cell array having memory cells;
    a reference cell array having reference cells used to identify data in the memory cells; and
    a dummy cell array including a programmable dummy cell that is located proximately to the reference cell array, further comprising a control circuit that programs the reference cells so that programming of the reference cells starts from both edges of the reference cell array and progresses towards the center thereof.

7. The semiconductor device as claimed in claim 1, further comprising a control circuit that programs the programmable dummy cell located at an edge of the dummy cell array after erasing data in the core cell array and the reference cell array, and then programs the reference cell array.

8. The semiconductor device as claimed in claim 1, wherein the memory cells have a charge trap layer made of an insulator, and bits of data are stored in the charge trap layer.

9. The semiconductor device as claimed in claim 1, wherein the programmable dummy cell located proximately to the reference cell array has a programmed state.

10. The semiconductor device as claimed in claim 1, wherein the dummy cell array comprises another programmable dummy cell, and the reference cell array is sandwiched between the programmable dummy cell and said another programmable dummy cell.

11. The semiconductor device as claimed in claim 1, wherein the dummy cell array comprises multiple programmable dummy cells, and only programmable dummy cell or cells among the multiple programmable dummy cells located proximately to the reference cell array have a programmed state.

12. The semiconductor device as claimed in claim 1, wherein the programmable dummy cell is located next to the reference cell array.

13. A method of programming a reference cell array having reference cells used to identify data in memory cells, comprising the steps of:
    erasing data in the memory cells and the reference cells of the reference cell array;
    programming a dummy cell of a dummy cell array located proximately to the reference cell array; and
    programming the reference cell array after the step of programming the dummy cell, wherein the step of programming of the reference cell array starts from reference cells located at both edges of the reference cell array.

* * * * *